US006856147B2

(12) United States Patent
Zarkhin et al.

(10) Patent No.: US 6,856,147 B2
(45) Date of Patent: Feb. 15, 2005

(54) RESISTIVE LOAD MEASUREMENT SYSTEM

(75) Inventors: Mikhail Zarkhin, West Bloomfield, MI (US); Timothy P Philippart, Orion, MI (US); Roger A. Moon, Ann Arbor, MI (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 87 days.

(21) Appl. No.: 10/342,946

(22) Filed: Jan. 15, 2003

(65) Prior Publication Data

US 2004/0135586 A1 Jul. 15, 2004

(51) Int. Cl.[7] .................. G01R 27/08; G01N 27/04; G01K 7/16
(52) U.S. Cl. .................. 324/693; 324/713; 73/1.06; 702/133
(58) Field of Search ................ 324/690, 647, 324/713, 720–721, 693; 73/23.21, 1.06; 702/24, 133

(56) References Cited

U.S. PATENT DOCUMENTS

| | | | | | |
|---|---|---|---|---|---|
| 4,519,237 A | * | 5/1985 | Kubo | ................... | 73/23.21 |
| 4,810,950 A | * | 3/1989 | Young | ................... | 324/708 |
| 5,091,698 A | * | 2/1992 | Grabs | ................... | 324/693 |
| 5,623,212 A | * | 4/1997 | Yamanaka | ............ | 324/693 |
| 6,096,186 A | * | 8/2000 | Warburton | ........... | 205/782 |
| 6,533,921 B2 | * | 3/2003 | Miyata et al. | ........ | 205/781 |

* cited by examiner

Primary Examiner—Anjan K. Deb
(74) Attorney, Agent, or Firm—Ralph E. Smith

(57) ABSTRACT

An improved system for determining the value of a resistive load is provided. The system includes: a reference voltage source; a reference resistor of known value having a first and second terminal, the first terminal connected to the reference voltage source and the second terminal connected to the resistive load; and a software program stored in a control unit connected to the first and second terminal, the control unit operative to read a value of the reference voltage source and a voltage at the second terminal of the predetermined reference resistor and to calculate the value of the resistive load as a function of the readings of the reference voltage source and the second terminal voltages.

19 Claims, 2 Drawing Sheets

RESISTIVE LOAD MEASUREMENT SYSTEM

FIELD OF THE INVENTION

The present invention relates generally to a resistive load measurement system, and more particularly to a system that employs a voltage divider technique for determining the value of a resistive load.

BACKGROUND OF THE INVENTION

Common resistive measurement techniques have been used to determine the value of an unknown resistive load. Two of the most common techniques for determining the value of an unknown resistor are by dropping a current through an unknown resistor and measuring the voltage across it or by setting up a Wheatstone Bridge circuit. Providing a known amount of current through an unknown resistor and measuring the voltage across it by a measuring device, such as a voltmeter, is a simple way of measuring the value of the unknown resistor. The Wheatstone Bridge is an electrical bridge circuit used to measure resistance. It consists of a common source of electrical current and a galvanometer that connects two parallel branches, containing four resistors, three of which the values are known. In the Wheatstone Bridge, the resistance of the unknown resistor is determined by adjusting and balancing the three known resistors until the current passing through the galvanometer decreases to zero. Both of the above mentioned techniques do not give a direct measurement of resistance.

Other techniques have been used to directly measure resistive loads such as using standard measuring devices known in the art. Although such devices generally work in a satisfactory manner, they are costly and inaccurate.

Therefore, it is desirable to provide an improved system that employs a technique for determining the value of an unknown resistive load. In addition, it is desirable to have a system that will monitor the value of the resistive load ensuring the resistive load remains at a reasonable value.

SUMMARY OF THE INVENTION

In accordance with the present invention, a resistive load measurement system is provided that employs a method for determining a value of an unknown resistive load. The system includes: a reference voltage source; a predetermined reference resistor having a first and second terminal, the first terminal connected to the reference voltage source and the second terminal connected to the resistive load; and a software program stored in a control unit connected to the first and second terminal. The control unit is operative to read a value of the reference voltage source and a voltage at the second terminal of the predetermined reference resistor and to calculate the value of the resistive load as a function of the readings of the reference voltage source and the second terminal voltage.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION

The following description is merely exemplary in nature and is in no way intended to limit the invention, its application, or uses.

Figure 1:
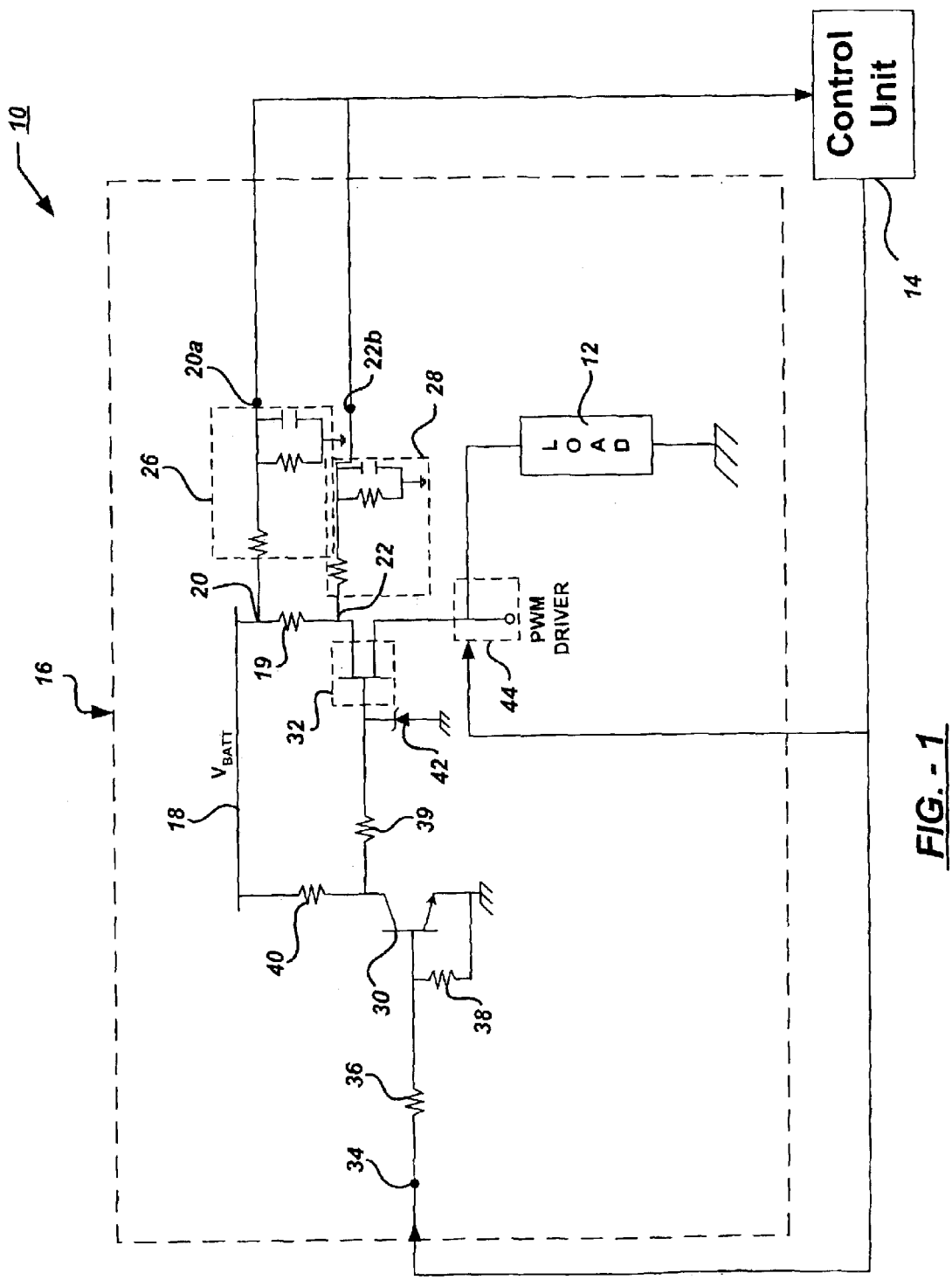
FIG. 1 is a resistive load measurement system that employs an improved method of determining the value of an unknown resistance in accordance with the present invention.

FIG. 1 illustrates a resistive load measurement system 10 for determining a value of an unknown resistive load 12. A control unit 14 is connected to a resistive measuring circuit 16, completing the system. The control unit 14 includes a stored program used to control and perform measurement readings of the unknown resistive load 12. Specifically, the control unit 14 uses the resistive measuring circuit 16 to determine the value of the unknown resistive load.

The resistive measuring circuit 16 includes a reference voltage source 18 connected to a predetermined reference resistor 19. The predetermined reference resistor 19 includes first and second terminals 20, 22 respectively. The first terminal 20 is connected to the reference voltage source 18. Terminal 22 is connected to a drain terminal of a switch 32. Low-pass filters 26, 28 respectively lie in between terminals 20 and 22 of reference resistor 19 and monitoring terminals 20a, 22b. Terminals 20a, 22b are coupled to the control unit 14. Low-pass filters 26, 28 are used to eliminate noise at the first and second terminals 20, 22 when voltage is applied to the terminals. It should be understood that the predetermined reference resistor 19 may be of any value depending on the application.

The control unit 14 controls the states of transistors 30 and 32 via control port pin 34. The control port pin 34 is coupled to a resistor 36. The control port pin 34 is a voltage pin that initiates measurement readings. Measuring circuit 16 can be enabled by applying a negative-going pulse to control port pin 34. The resistor 36 is also coupled to transistor 30. Resistor 36 defines the base current of the transistor 30.

Biasing resistor 38 is coupled between the base and emitter terminals of transistor 30. Resistor 38 provides the path to ground for a reverse collector current of transistor 30. The collector of transistor 30 is coupled to a resistor 39. Resistor 39 is also coupled to transistor switch 32 and a resistor 40.

Resistor 40 is coupled to the reference voltage source 18 of the measuring circuit 16. A zenor diode 42 couples the gate electrode of transistor switch 32 to ground for protecting the gate terminal of the switch 32 from excessive voltage. The sum of the values of the resistors 39, 40 define the current of the zenor diode 42. The switch 32 is implemented using a transistor, such as a n-channel MOSFET. Specifically, transistor 30 is bipolar and a NPN transistor. It should be understood that other types of transistors and switches can be used within the scope of the present invention.

The control unit also controls a Pulse-Width Modulated (PWM) driver 44. The driver 44 is coupled between the source terminal of switch 32 and the resistive load 12. In doing so, current can flow from the switch 32 to the resistive load 12 when the driver 44 is turned off and switch 32 is turned on. The driver 44 provides an average voltage over the resistive load 12 when switch 32 is turned off and driver 44 is turned on.

In operation, the control unit 14 applies a negative pulse to the control port pin 34 to turn the first transistor 30 off. As a result, a voltage will be applied on the gate of transistor 32, thereby rending transistor 32 conductive. Transistor switch 32 is closed and the PWM driver 44 is turned off. Current flows from the voltage source 18 through the predetermined reference resistor 19, the switch 32, and the resistive load 12. The resistive load 12 and the predetermined reference resistor 19, create a voltage divider. The control unit 14 reads the voltage at terminal 20a and terminal 22b. The control unit 14 then calculates the value of the resistive load 12 by taking the voltage at terminal 22b, dividing that value by the difference between the voltage at terminal 20a and the voltage at terminal 22b, and multiplying that answer by the value of the predetermined resistance 19.

The calculated value of the resistive load 12 is then compared to a predetermined value. The predetermined value usually represents a value for the resistive load 12 in normal operation. If the calculated value deviates from the predetermined value, the control unit 14 adjusts the PWM current flow being provided to the resistive load 12 from the driver 44.

In one application, the resistive load 12 is a sensor heater used to heat an oxygen sensor (not shown). In this example, the resistance of the load 12 is used to indirectly determine the temperature of the oxygen sensor. Since the sensor heater is packaged with the oxygen sensor, the temperature of the heater is reflective of the temperature of the oxygen sensor.

In operation, the control unit 14 determines the resistance of the sensor heater by the method described above. Once the control unit 14 determines the resistance of the sensor heater, the control unit 14 compares the resistive value of the sensor heater to a predetermined value and adjusts the PWM current flow through the heater resistance to, in turn, adjust the temperature of the oxygen sensor based on this comparison.

While the above description is provided with reference to a method for determining the resistance of a sensor heater and the temperature of an oxygen sensor based upon the resistance of the sensor heater, it is readily understood that broader aspects of the present invention are also applicable to other types of sensors and loads.

Figure 2:
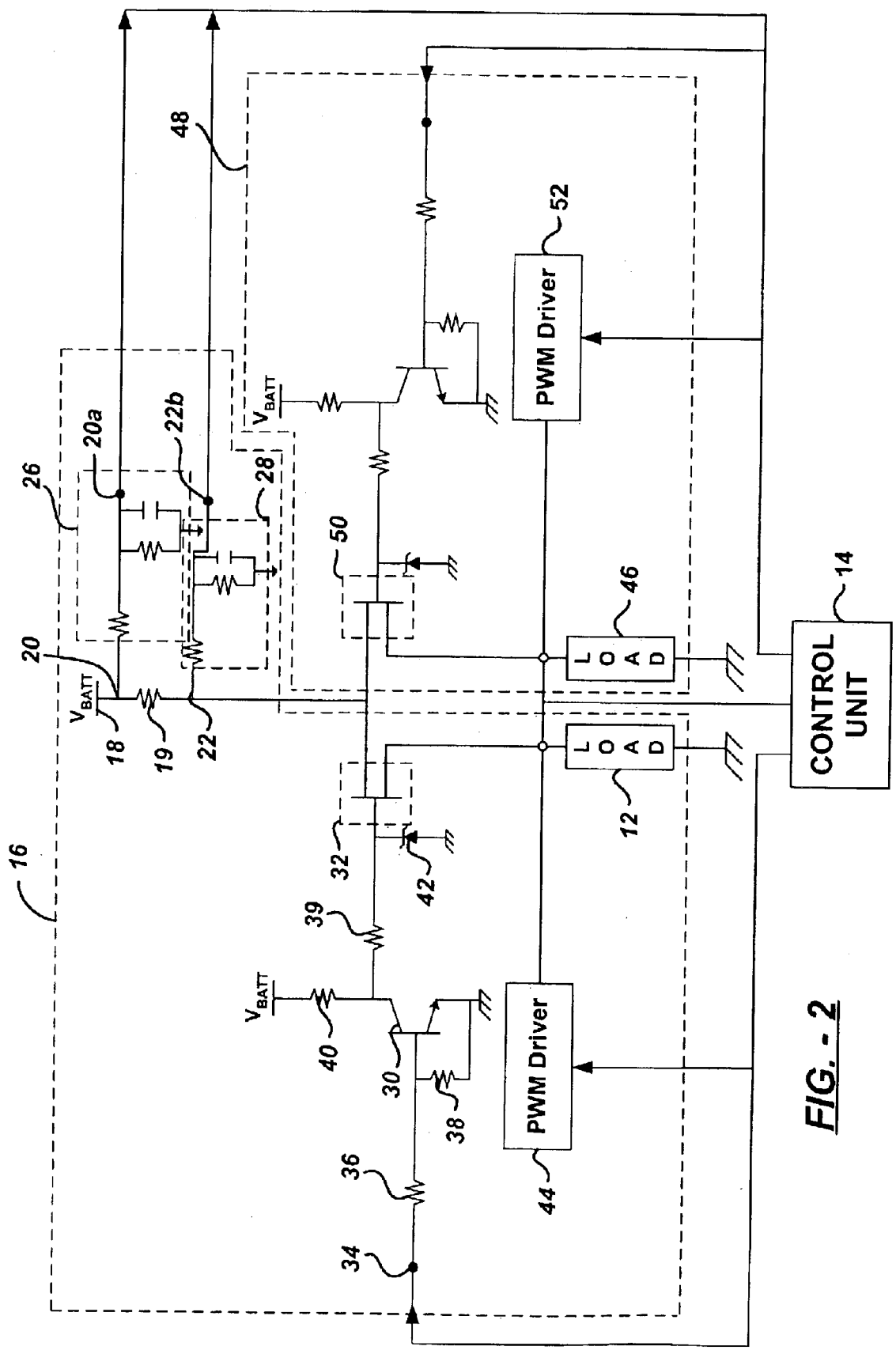
FIG. 2 is a resistive load measurement system that employs an improved method of determining the value of a plurality of unknown resistances in accordance with the present invention.

In another application, an unknown resistive load 46 is connected to the resistive measuring circuit 16 as shown in FIG. 2. In this example, a second measuring circuit 48 having a third switch 50 connected to the unknown resistive load 46 is connected to both the predetermined reference resistor 19 and the control unit 14. By doing so, both unknown resistive loads 12, 44 can be measured. A second PWM driver 52 is connected to the unknown resistive load 46 to provide an average voltage to the load 46.

In operation, the second PWM driver 52 is turned on, applying an average current to the resistive load 46. The control unit 14 then opens the switch 32 and closes a switch 50. At this time, the second PWM driver 52 is turned off. The unknown resistive load 46 and the predetermined reference resistor 19 create a voltage divider. The control unit 14 determines the value of the unknown resistive load 46 by the method described above. It should be understood that a multiple number of loads can be connected. The control unit measures one load at a time.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus for determining a value of a resistive load comprising:
    a reference voltage source;
    a reference resistor having a known value and having a first and second terminal, the first terminal coupled to the reference voltage source and the second terminal coupled to the resistive load;
    a first switch operative to connect the resistive load with the reference resistor to create a voltage divider; and
    a control unit coupled to the first and second terminal, the control unit including a software program operative to read a value of the reference voltage source and a voltage at the second terminal and to calculate the value of the resistive load as a function of the readings of the reference voltage source, the second terminal voltage, and the known value of the reference resistor.

2. The apparatus of claim 1 wherein the control unit is operative to compare the value calculated for the resistive load to a predetermined value.

3. The apparatus of claim 2 further comprising a driver operative to provide a current to the resistive load and adjust the current in the resistive load when the value calculated deviates from the predetermined value, and wherein the control unit software program is further operative to disable the driver whenever the value of the resistive load is being calculated.

4. The apparatus of claim 3, wherein the driver is pulse-width modulated.

5. The apparatus of claim 1 further comprising a second switch operative to provide a voltage to the first switch, wherein the control unit engages one of said switches and disengages the other of said switch.

6. The apparatus of claim 1 further comprising a plurality of resistive loads connected to the predetermined reference resistor wherein the control unit calculates at least one of the plurality of resistive loads.

7. The apparatus of claim 1 wherein the resistive load comprises an oxygen sensor heater.

8. The apparatus of claim 7 wherein the control unit indirectly measures a temperature of an oxygen sensor by measuring the resistance of the oxygen sensor heater.

9. A method for determining a value of a resistive load comprising the steps of:
    providing a reference voltage source and a predetermined reference resistor having a known value and having a first and second terminal, connecting the first terminal to the reference voltage source and connecting the second terminal to the resistive load;
    providing a switch operative to connect the resistive load to the reference resistor to create a voltage divider;
    providing a software program stored in a control unit and connecting the control unit to the first and second terminal;
    reading a value of the reference voltage source and a voltage at the second terminal of the predetermined reference resistor; and
    calculating with the software program the value of the resistive load as a function of the readings of the reference voltage source, the second terminal voltages, and the known value of the reference resistor.

10. The method of claim 9 further comprising the steps of:
    comparing the calculated value of the resistive load to a predetermined value; and
    providing a driver operative to provide a current to the resistive load, the software program operative to disable the driver whenever the value of the resistive load is to be calculated.

11. The method of claim 10 wherein the driver is pulse-width modulated.

12. The method of claim 9 further comprising the step of adjusting the current provided by the driver to the resistive load when the value calculated deviates from the predetermined value.

13. The method of claim 9 further comprising the step of a providing a second switch operative to provide a voltage to the first switch, wherein the control unit engages one of the switches and disengages the other of the switches.

14. The method of claim 9 further comprising the step of connecting a plurality of resistive loads to the predetermined reference resistor wherein the control unit calculates at least one of the plurality of resistive loads.

15. The method of claim 9, wherein said resistive load is an oxygen sensor heater.

16. The method of claim 15, wherein the control unit indirectly measures a temperature of an oxygen sensor by measuring the resistance of the oxygen sensor heater.

17. An oxygen sensor temperature measurement system comprising:

an engine controller having an oxygen sensor and an oxygen sensor heater operable to heat the oxygen sensor;

a resistance measuring circuit having a reference voltage source and a reference resistor having a known value;

a switch coupled to the oxygen sensor heater, the switch operative to connect the oxygen sensor heater to the reference resistor to create a voltage divider;

a driver operative to provide a load current to the oxygen sensor heater;

a control unit operable to disable the driver and thereafter to measure a resistance of the oxygen sensor heater using the resistance measuring circuit, and to determine a temperature of the oxygen sensor based on the resistance of the oxygen sensor heater.

18. The system of claim 17 wherein the driver is pulse-width modulated.

19. The system of claim 17 further comprising a plurality of oxygen sensor heaters connected to the predetermined reference resistor wherein the control unit of oxygen calculates at least one of the plurality of sensor heaters.

* * * * *